US006376864B1

(12) United States Patent
Wang

(10) Patent No.: US 6,376,864 B1
(45) Date of Patent: Apr. 23, 2002

(54) SEMICONDUCTOR LIGHT-EMITTING DEVICE AND METHOD FOR MANUFACTURING THE SAME

(76) Inventor: Tien Yang Wang, 468 Lowell St., Lexington, MA (US) 02420

( * ) Notice: Subject to any disclaimer, the term of this patent is extended or adjusted under 35 U.S.C. 154(b) by 0 days.

(21) Appl. No.: 09/598,098

(22) Filed: Jun. 21, 2000

Related U.S. Application Data

(60) Provisional application No. 60/143,756, filed on Jul. 6, 1999.

(51) Int. Cl.$^7$ ............................................... H01L 33/00
(52) U.S. Cl. ...................................................... 257/98
(58) Field of Search .......................... 257/98; 438/39; 372/44, 43, 48

(56) References Cited

U.S. PATENT DOCUMENTS

| | | | |
|---|---|---|---|
| 5,517,039 A | | 5/1996 | Holonyak et al. |
| 5,744,829 A | | 4/1998 | Murasato et al. |
| 5,848,086 A | * | 12/1998 | Lebby et al. ................. 372/46 |
| 6,057,560 A | * | 5/2000 | Uchida ......................... 257/94 |

OTHER PUBLICATIONS

D. E. Aspnes et al., "Optical Properties of AlGaAs," J. Appl. Phys., vol. 60 (1986) pp. 754–767.
H. Sugawara et al., Hybrid–Type InGaAlP/GaAs Distributed Bragg Reflectors for InGaAlP Light–Emitting Diodes, Jpn. J. Appl. Phys., vol. 33 (1994) pp. 6195–6198.
M. Moser et al., "Refractive Index of AlGaInP Grown by MOVPE," Appl. Phys. Lett. vol. 64 (1994) pp. 235–237.
Y. Kaneko et al., "Refractive Indices Measurement of (GaInP)(AlInP) Quasi–quaternaries and GaInP/AlInP Multiple Quantum Wells," J. Appl. Phys., vol. 76 (1994) pp. 1809–1818.
O. S. Heavens et al., "Staggered Broad–band Reflecting Multilayers," Applied Optics, vol. 5 (1966) pp. 373–376.
S. D. Hersee et al., "A Study of The Orientation Dependence of GaAlAs Grown by MOVPE," Journal of Crystal Growth, vol. 77 (1986) pp. 310–320.
H. F. J. Van'T Blik et al., "On the MOVPE Growth of Self–aligned Laser Structures," Journal of Crystal Growth, vol. 92 (1988) pp. 165–170.
J. M. Dallasasse et al., "Hydrolyzation Oxidation of AlGaAs–AlAs–GaAs Quantum Well Heterostructures and Superlattices," Appl. Phys. Lett. vol. 57 (1990) pp. 2844–2846.
J. J. Wierer et al., "Tunnel Contact Junction Native–oxide Aperture and Mirror Vertical–cavity Surface–emitting Lasers and Resonant–cavity LED," Appl. Phys. Lett., vol. 74 (1999) pp. 926–928.
A. Bek et al., "A Study of Wet Oxidized AlGaAs for Integrated Optics," IEEE Photonics Technology Letters, vol. 11 (1999) pp. 436–438.

* cited by examiner

Primary Examiner—Douglas A Wille
(74) Attorney, Agent, or Firm—Brian K. Dinicola

(57) ABSTRACT

Semiconductor light-emitting devices and methods for their manufacture using an efficient reflector to minimize optical loss due to the substrate absorption. The reflector comprises a plurality of discrete quarter-wave stacks deposited on a patterned substrate, allowing for current injection around the discrete reflector stacks. The reflector is further characterized by a high refractive-index ratio suitable for broadband high-reflectance applications of the light-emitting device.

14 Claims, 11 Drawing Sheets

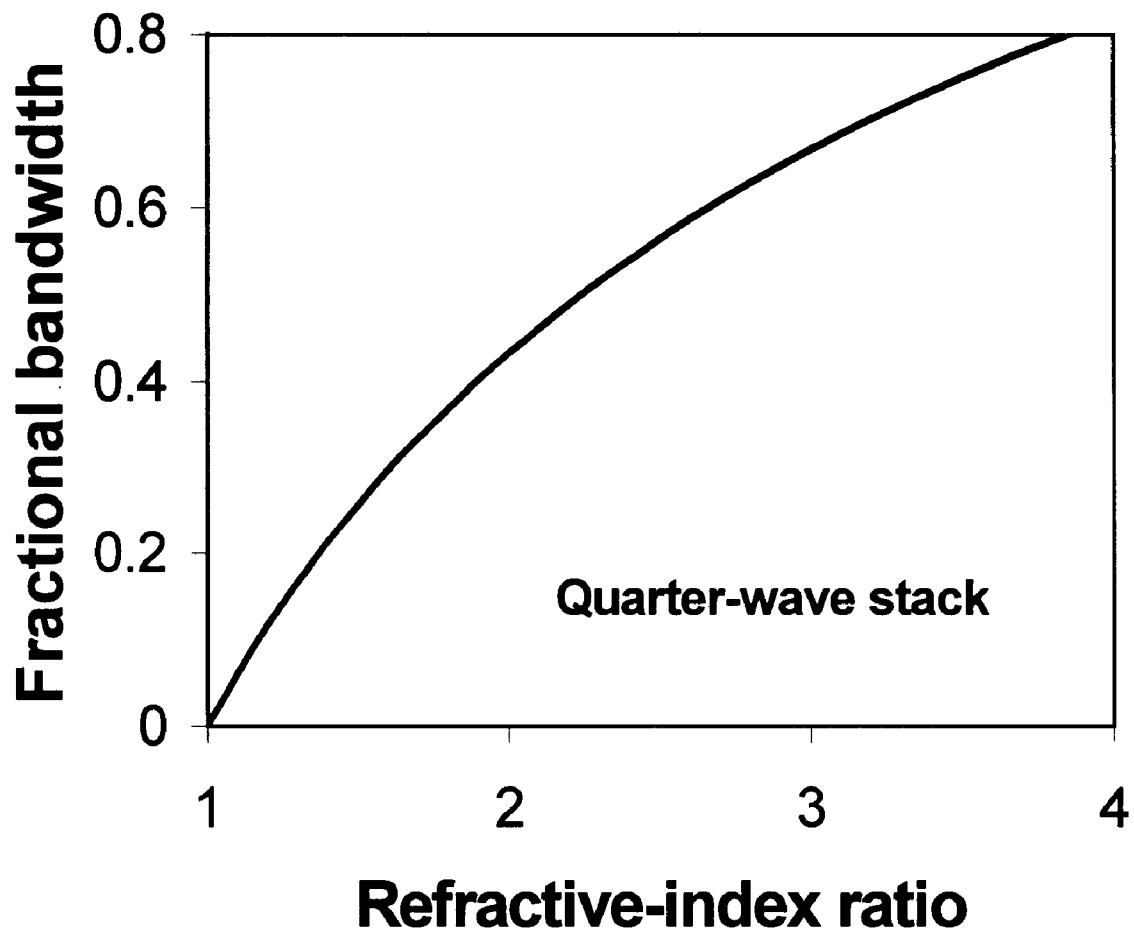
FIG. 5 (known)

SEMICONDUCTOR LIGHT-EMITTING DEVICE AND METHOD FOR MANUFACTURING THE SAME

This application claims benefit of Provisional application No. 60/143,756, filed Jul. 6, 1999.

BACKGROUND OF THE INVENTION

1. Field of the Invention

The present invention relates generally to semiconductor light-emitting devices and, more particularly, to light emitting devices which employ an efficient reflective mirror to minimize optical loss by substrate absorption.

2. Discussion of the Prior Art

High efficiency visible light emitting devices (LED) are highly desirable for such applications as large area displays, traffic signal lighting and automotive lighting. Even though the internal quantum efficiency of a visible LED may be very high, its luminescence performance is typically limited by the light extraction efficiency. Among other factors such as the internal reflection loss at the chip surface and the blocking of light by the contact electrode, the light absorption by the substrate represents a major optical loss of the light emission. Conventional approaches to achieving reduction of substrate absorption loss include the use of a semiconductor Bragg reflector (BR) and the use of transparent-substrate LED.

S. Murasato et al have disclosed, in U.S. Pat. No. 5,744,829, an AlGaInP LED on GaAs substrate containing a BR using multiple layers of AlGaAs between the substrate and the double hetero-junction (DH) light-emitting structure. For example, a BR comprising ten to twelve pairs of [$Al_{0.4}Ga_{0.6}As$—$Al_{0.95}Ga_{0.05}As$] was proposed to provide a reflectivity of 90% or more at an emission wavelength of 570 nm. Such a high reflectivity is only obtained if assuming a fixed refractive index of 3.7 for $Al_{0.4}Ga_{0.6}As$ and 3.146 for $Al_{0.95}Ga_{0.05}As$ with no dispersion and non-absorbing. However, the index dispersion and absorption of the lower-index layer are important in affecting the reflectance of the BR. As described by D. E. Aspnes et al in J. Appl. Phys. 60 (1986) pp. 754–767, the real (n) and imaginary (k) part of the complex index of refraction of the AlGaAs layers have a finite value and varies with the emission wavelength. A more realistic estimate of the reflectance of the proposed BR is less than 60%. The calculated reflectance spectrum of the [$Al_{0.4}Ga_{0.6}As$—$Al_{0.95}Ga_{0.05}As$] BR is shown in FIG. 1a using the AlInP lower confining layer as the incident medium. The reflectance of the BR drops rapidly for light emitting at an angle greater than 22 degree. The angular dependence of the 570-nm reflectance of the BR is shown in FIG. 1b.

H. Sugawara et al have described a high reflectivity of 70% using a 10-pair [AlInP—GaAs] BR or a 20-pair [AlInP—$(Al_{0.5}Ga_{0.5})_{0.5}In_{0.5}P$] BR in Jpn. J. Appl. Phys. Vol.33 (1994) Pt.1, pp. 6195–6198. The reflectance bandwidth of the [AlInP—GaAs] BR was found to be greater than that for the [AlInP—AlGaInP] BR. The authors have assumed a fixed value of the refractive index and absorption coefficient of each layer in their calculations. However, a strong dispersion of the refractive index (n and k) of AlGaInP layers especially near the band edge has been determined using the ellipsometry method as reported by M. Moser et al in Appl. Phys. Lett. Vol.64 (1994) pp.235–237 and using the reflectance method as reported by Y. Kaneko et al in J. Appl. Phys. Vol.76 (1994) pp.1809–1818. Taking into account the dispersion relationship of the refractive index for each layer, the maximum reflectance at a wavelength of 570 nm is found to be below 35% for the [AlInP—GaAs]20 BR and [AlInP—$(Al_{0.5}Ga_{0.5})_{0.5}In_{0.5}P$]20 BR. This value is only half of that published by H. Sugawara et al. The calculated reflectance spectrum and the angular variation of the 570-nm reflectance are shown in FIG. 2a and FIG. 2b for the [AlInP—GaAs]20 BR, and in FIG. 3a and FIG. 3b for the [AlInP—$(Al_{0.5}Ga_{0.5})_{0.5}In_{0.5}P$]20BR, respectively.

H. Sugawara et al have also described a wide-band, high reflectivity BR using hybrid [AlInP—GaAs]—[AlInP—AlGaInP] multiple layers. The reflectivity of the hybrid-type BR is 70% at an emission wavelength of 570 nm if assuming a non-dispersive n and k for each layer. However, actual reflectance of the hybrid-type BR is only 26% due to the dispersion of the refractive index for each layer. The calculated reflectance spectrum and the angular variation of the 570-nm reflectance of the [AlInP—GaAs]10-[AlInP—AlGaInP]10 hybrid BR are shown in FIG. 4a and FIG. 4b, respectively. The low reflecting power and high angular sensitivity of the prior art BR design has restricted the overall light-extraction efficiency of the LED.

The fractional bandwidth of a quarter-wave stack BR is given by $$\Delta\sigma/\sigma o = 4/\pi \arcsin (n_H/n_L-1)/(n_H/n_L+1)$$

where $\sigma o = 1/\lambda o$ and $\lambda o$ is the wavelength at which the layer thickness are quarter-waves. The $n_H/n_L$ represent the refractive-index ratio of the high- and low-index layer, respectively, as described by O. S. Heavens et al in Applied Optics, Vol.5 (1966) pp.373–376. FIG. 5 shows that the fractional bandwidth increases as the refractive-index ratio increases. The prior art semiconductor BR has a small refractive-index ratio in the visible region of the spectrum and a narrow reflectance band. For example, using index values of 3.289, 3.225, 3.998 for AlInP, AlAs and GaAs layers, respectively, one obtains an index ratio of 1.2 for the [GaAs—AlAs] and [GaAs—AlInP] quarter-wave stacks at a wavelength of 570 nm. This corresponds to a fractional bandwidth of only 0.14 for the prior art BR. A larger ratio is clearly preferable for broad bandwidth applications. However, it is impractical to find semiconductor materials with an index ratio of greater than 2 while electrically conductive and lattice-matched to the substrate.

The small refractive index differential in the prior art BR design has practical drawbacks in the LED production. It requires a large number of pairs and long crystal growth cycle to obtain high reflectance. The narrow reflection bandwidth of the BR means a small fabrication tolerance and demands rigorous control of epitaxial growth process. A broad bandwidth BR is also desirable due to the broad spontaneous emission spectrum of the LED.

SUMMARY OF THE INVENTION

The aforementioned deficiencies are addressed, and an advance is made in the art, by a semiconductor light-emitting device which employs an efficient reflector to minimize optical loss due to substrate absorption. The reflector comprises structured quarter-wave stacks deposited on a patterned substrate that is configured to allow for current injection around the discrete reflector stacks. The reflector is further characterized by a high refractive-index ratio ($n_H/n_L$) suitable for broad-bandwidth high reflectance application of the light-emitting device.

A device constructed in accordance with an illustrative embodiment of the invention is obtained by forming Bragg reflector (BR) stack portions on a patterned substrate using conventional epitaxial growth methods. Illustratively, a surface of the textured substrate defines a channel structure wherein surface portions of different elevation are realized. The specific geometry of the textured substrate is selected so as to facilitate the discrete deposition of the BR layers on top of the hills and in the valleys. The region between the isolated BR stacks is reserved for paths of current injection.

After the growth, the wafers fabricated in accordance with the illustrative method are provided with a surface groove member to expose high aluminum-content AlGaAs layers in the BR. The wafers are then transferred to a furnace and steam oxidized to laterally convert the high aluminum-content AlGaAs layers into AlOx. The as deposited GaAs—AlAs BR is thus converted into GaAs-AlOx BR as a result of the selective oxidation of the AlGaAs layer. The new GaAs-AlOx BR has a high index ratio of 2.26 due to the very low refractive index of 1.77 for AlOx. Highly reflective, broad bandwidth BR is thus materialized using the new structured BR in the present invention. The reflector stack in the present invention has a broadband, high spectral and angular reflectivity suitable for the fabrication of high efficiency bright LED's.

The present invention will be best described in detail with reference to the figures listed and is described below.

BRIEF DESCRIPTION OF THE DRAWINGS

FIG. 5 shows how the fractional bandwidth varies with the refractive-index ratio of a BR.

DETAILED DESCRIPTION OF THE INVENTION

Figure 1A:
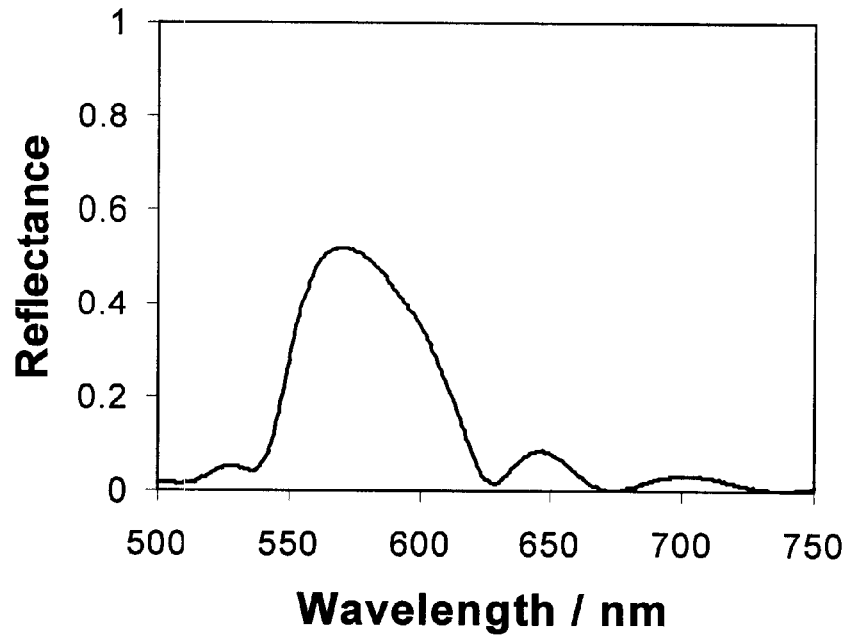
FIG. 1a is the calculated reflectance spectrum and FIG. 1b is the angular variation of the 570-nm reflectance of a prior art [$Al_{0.4}Ga_{0.6}As$—$Al_{0.95}Ga_{0.05}As$]12 BR.
Figure 1B:
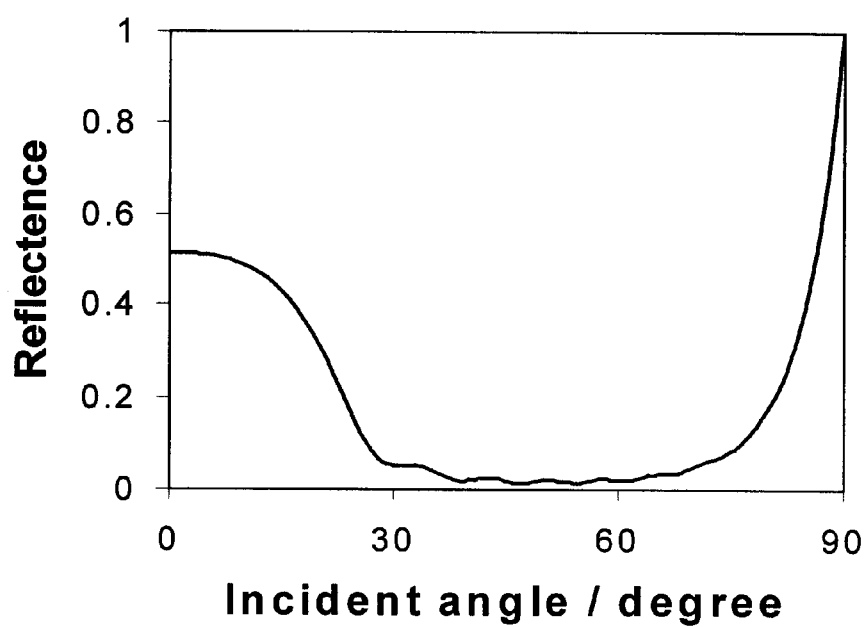
Figure 2A:
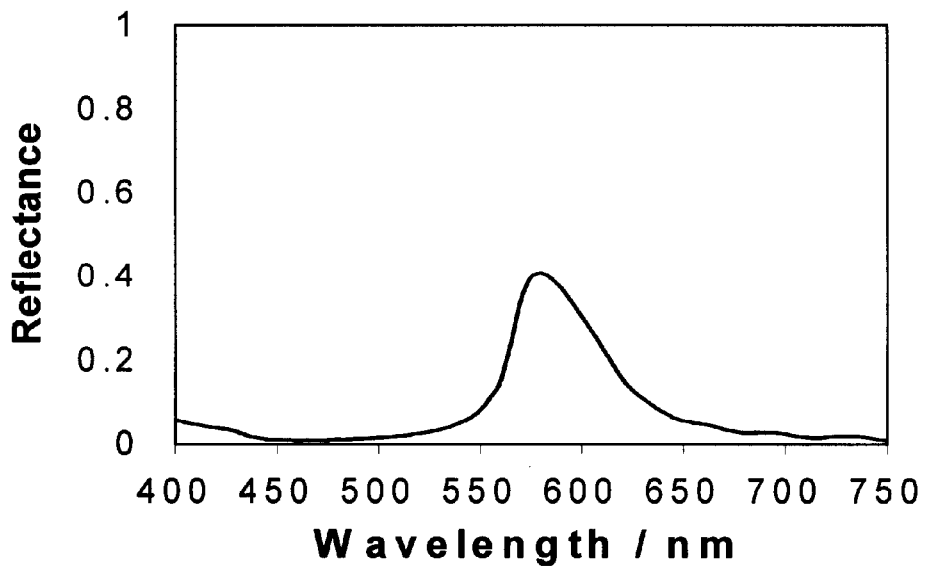
FIG. 2a is the calculated reflectance spectrum and FIG. 2b is the angular variation of the 570-nm reflectance of a prior art [AlInP—GaAs]20 BR.
Figure 2B:
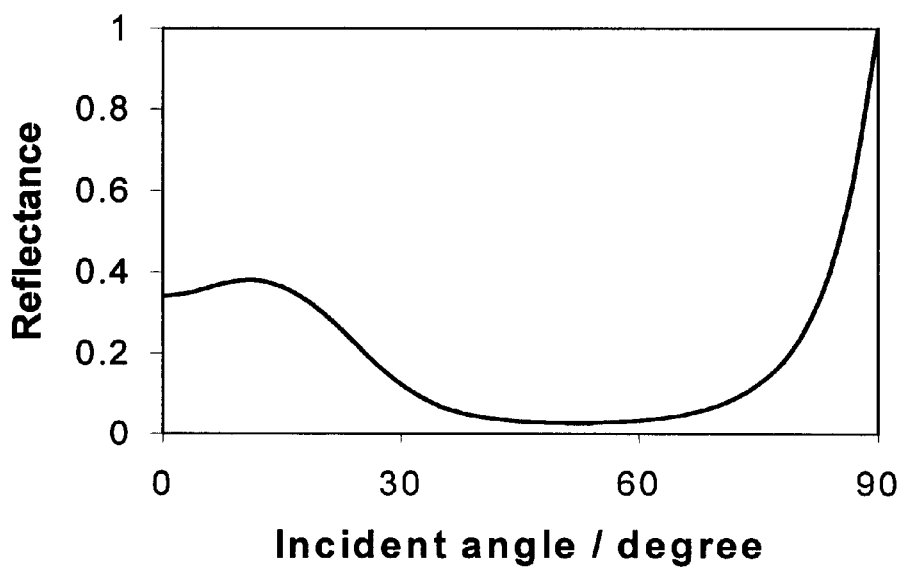
Figure 3A:
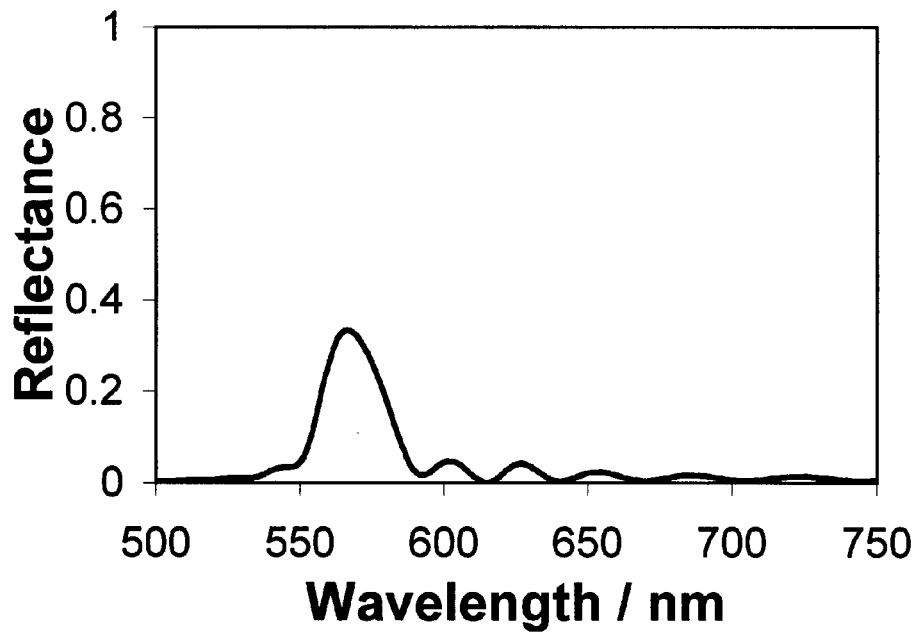
FIG. 3a is the calculated reflectance spectrum and FIG. 3b is the angular variation of the 570-nm reflectance of a prior art [AlInP—$(Al_{0.5}Ga_{0.5})_{0.5}In_{0.5}P$]20 BR.
Figure 3B:
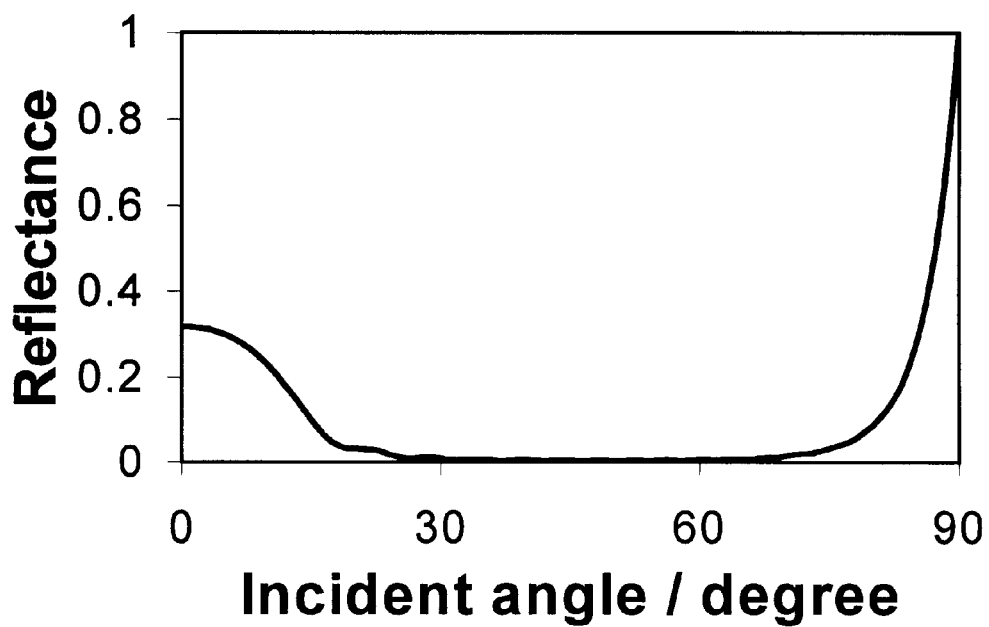
Figure 4A:
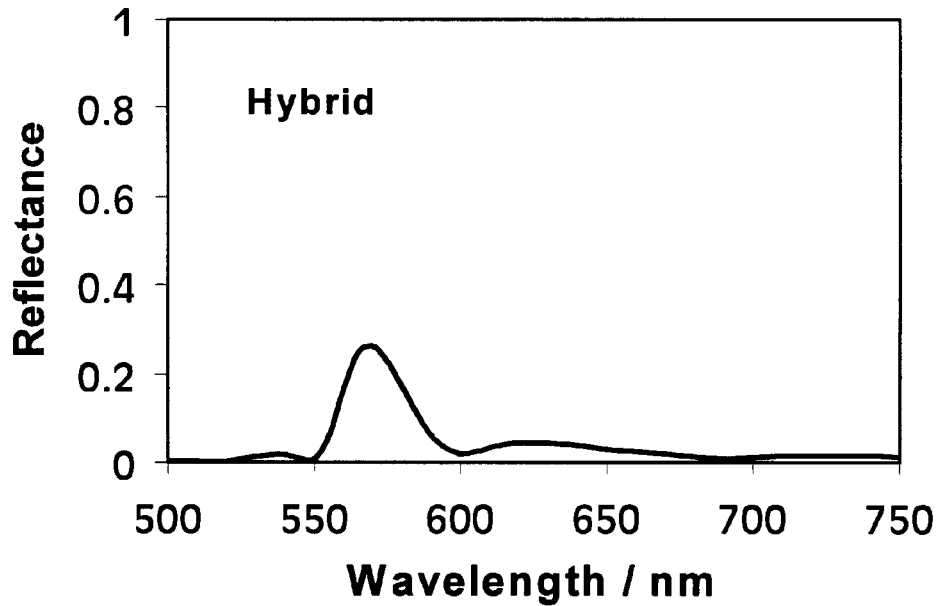
FIG. 4a is the calculated reflectance spectrum and FIG. 4b is the angular variation of the 570-nm reflectance of a prior art [AlInP—GaAs]10-[AlInP—AlGaInP]10 hybrid BR.
Figure 4B:
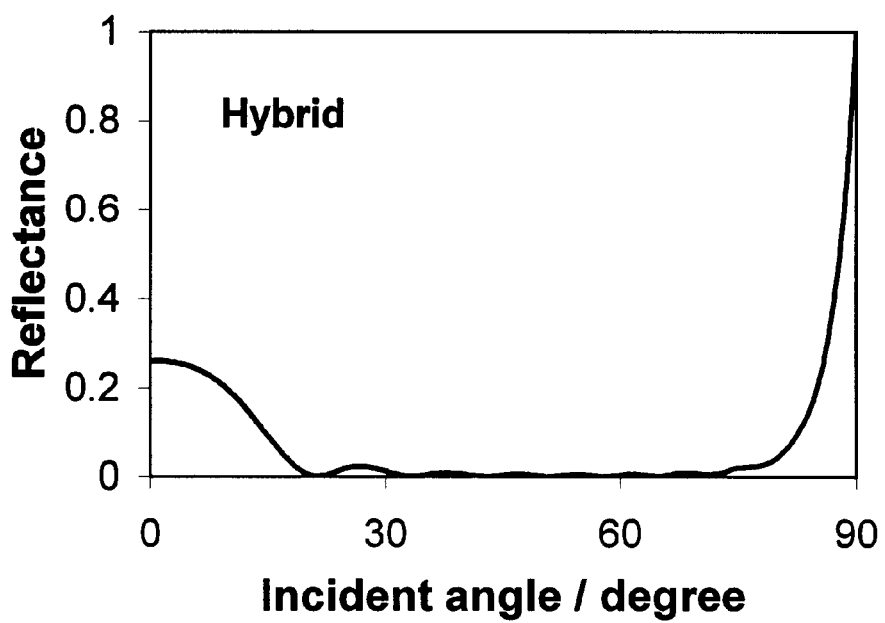
Figure 6:
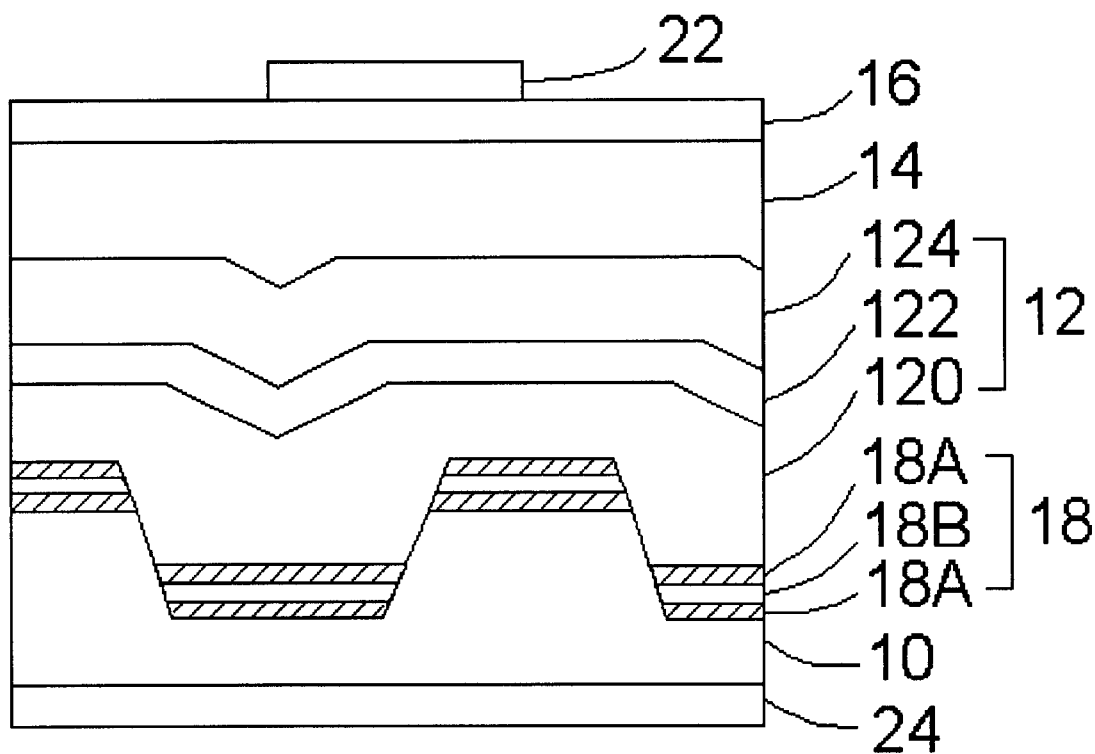
FIG. 6 is a schematic diagram of an LED in accordance with the embodiment of the present invention containing a structured [AlAs—GaAs]n BR.

In accordance with an illustrative embodiment of the present invention, a semiconductor Bragg Reflector (BR) is first formed on a patterned substrate using conventional epitaxial growth methods. FIG. 6 is a cross sectional view of a light emitting device (LED) constructed in accordance with an illustrative embodiment of the present invention. In the illustrative embodiment depicted in FIG. 6, a double heterojunction LED (DH-LED) is deposited on a patterned GaAs substrate 10 and comprises a Bragg reflector (BR) 18. The Bragg reflector 18 was first grown on patterned GaAs substrate 10, comprising alternating low- 18A and high- 18B index layer, followed by AlGaInP DH 12, comprising a lower n-AlGaInP confining layer 120, an AlGaInP active layer 122 and an upper p-AlGaInP confining layer 124, a p-type GaP window layer 14, and a p-GaAs contact layer 16. The p-electrode 22 and the n-electrode 24 were formed using AuZn/Au and AuGe/Au, respectively. The preferred thickness of the AlGaInP layers is 0.5–1 um and the p-type GaP window layer 14 is preferably 2–15 um in thickness.

The preferred method to fabricate the AlGaInP layers is metalorganic vapor phase epitaxy (MOVPE). Typical source nutrients include trimethyl compounds such as TMGa, TMIn, TMAl for group III elements, and group V hydrides such as arsine and phosphine for the group V elements. Disilane and dimethyl zinc are typically used as the n- and p-type dopants, respectively. The process is preferably carried out in a reduced pressure reactor about 0.1 atm and a high substrate temperature of 760 degree centigrade for the growth of high Al-content layers. A high V/III ratio is preferred for the growth of AlGaInP layers and substrate rotation is employed to improve the growth uniformity.

In this example, a high Al-content AlGaAs layer such as AlAs and $Al_{0.98}Ga_{0.02}As$ is used as the low-index layer 18A and a low Al-content AlGaAs layer including GaAs is used as the high-index layer 18B. The geometry of the structured substrate is such that to facilitate the discrete deposition of the BR layers on top of the hill and in the valley. The preferred direction of the channel is along the [011] direction defined using conventional etching methods. The MOVPE growth on patterned substrates has been described by S. D. Hersee et al in J. Crystal Growth Vol.77 (1986) pp.310–320 and by H. F. J. Van 'T Blik et al in J. Crystal growth Vol.92 (1988) pp.165–170. The MOVPE growth in the [011] channel is characterize by the presence of the (111)B non-growth planes which isolate the BR layers grown on top of the hill from these grown in the valley. The region between the structured BR stacks is reserved as paths for current injection. By proper design of the channel geometry, the active layer and the top surface of the LED wafer can be made either planar or textured.

Figure 7:
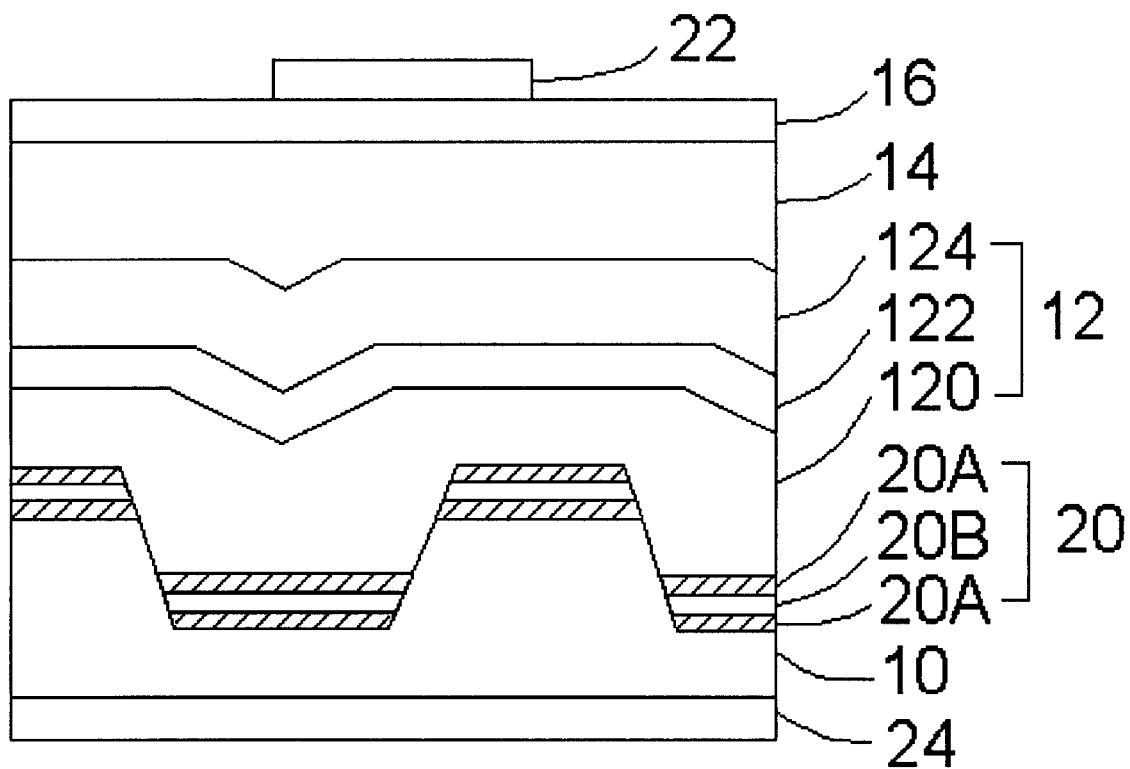
FIG. 7 is a schematic diagram of an LED in accordance with the embodiment of the present invention showing the formation of the structured [AlOx-GaAs]n BR after channel oxidation.

In the next step of the process in the present invention, the index ratio of the BR stack is enhanced using selective steam-oxidation of the high Al-content layers. For example, grooves are formed across the epi-surface to expose the high aluminum-content AlGaAs layers of the BR. The wafers are then transferred to a furnace and steam oxidized to laterally convert the high aluminum-content AlGaAs layers into native AlOx channels. For example, the as deposited [GaAs—AlAs]BR 18 is converted into [GaAs-AlOx]BR 20 as a result of the selective oxidation of the AlAs layer. FIG. 7 is a schematic diagram of an LED in accordance with the embodiment of the present invention showing the formation of the structured [AlOx-GaAs]n BR after channel oxidation. After wet oxidation, the wafers are processed into chips and encapsulated in conventional epoxy packages. Typical oxidizing environments are at 430 degree C. in an ambient of steam in nitrogen carrier gas. The detailed oxidation condition has been described by J. M. Dallasasse et al in Appl. Phys. Lett. Vol.57 (1990) pp.2844–2846. This method has been employed to form the current apertures in the vertical cavity surface-emitting lasers and in the resonant-cavity LED as described by J. J. Wierer et al in Appl. Phys. Lett. Vol.74 (1999) pp.926–928. Typical oxidation rates for different materials are 62 um/hr for AlAs, 4 um/hr for GaAs, and <0.1 um/hr for AlInP. Another benefit of the manufacturing process in the present invention comes from the facial coverage of a thin oxide skin over the AlGaInP layers after wet oxidation. The protective oxide skin warrants the reliable operation of the light-emitting device in hot and humid environments as described by N. Holonyak et al in U.S. Pat. No. 5517039.

Figure 8A:
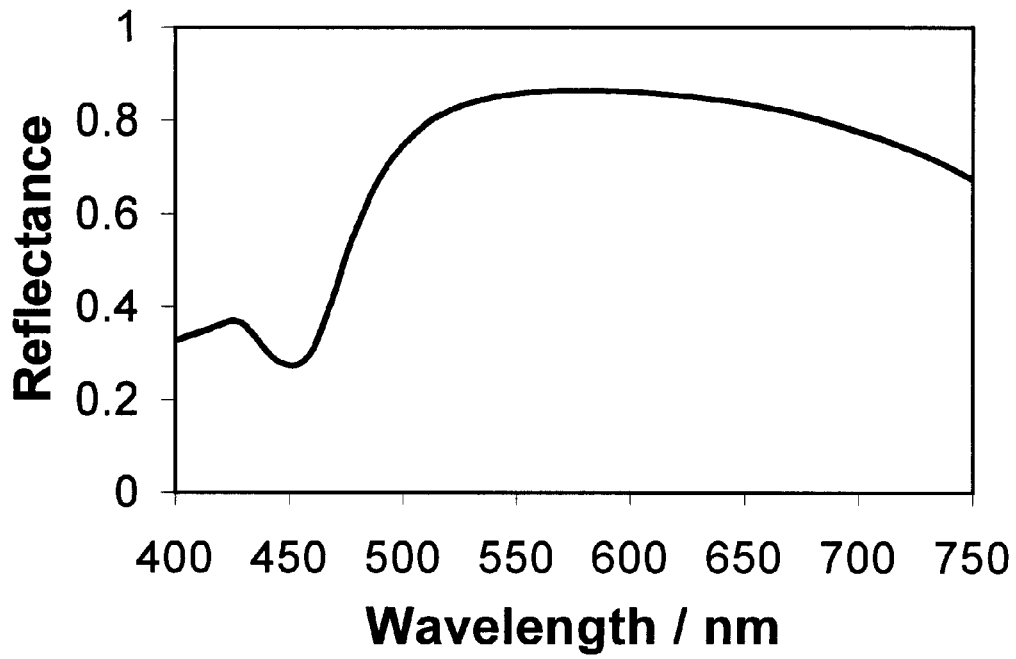
FIG. 8a is the calculated reflectance spectrum and FIG. 8b is the angular variation of the 570-nm reflectance of an LED in accordance with the embodiment of the present invention comprising an [AlOx-GaAs]3 BR.
Figure 8B:

The new GaAs-AlOx BR has a very high index ratio of 2.26 since the refractive index of AlOx is as low as 1.77 as measured by A. Bek et al in IEEE Photonics Technology Letters, Vol.11 (1999) pp.436–438. Highly reflective, broad bandwidth BR is thus materialized using the structured BR in the present invention. For example, FIG. 8a shows the calculated reflectance spectrum and FIG. 8b is the angular variation of the 570-nm reflectance of an LED in accordance with the embodiment of the present invention comprising an [AlOx-GaAs]3 BR. The BR has a very broad reflection bandwidth with a reflectance higher than 70% in the 500 nm to 700 nm region of the spectrum. More interesting is the characteristic "V-shape" dependence of the reflectance versus the incident angle of the emitted light. The majority of the downward light emission is reflected back away from the substrate interface and the chance of light extraction at the top surface is greatly enhanced. This is compared with the angular dependence of the prior art BR where the majority of the light is lost due to substrate absorption.

Figure 9A:
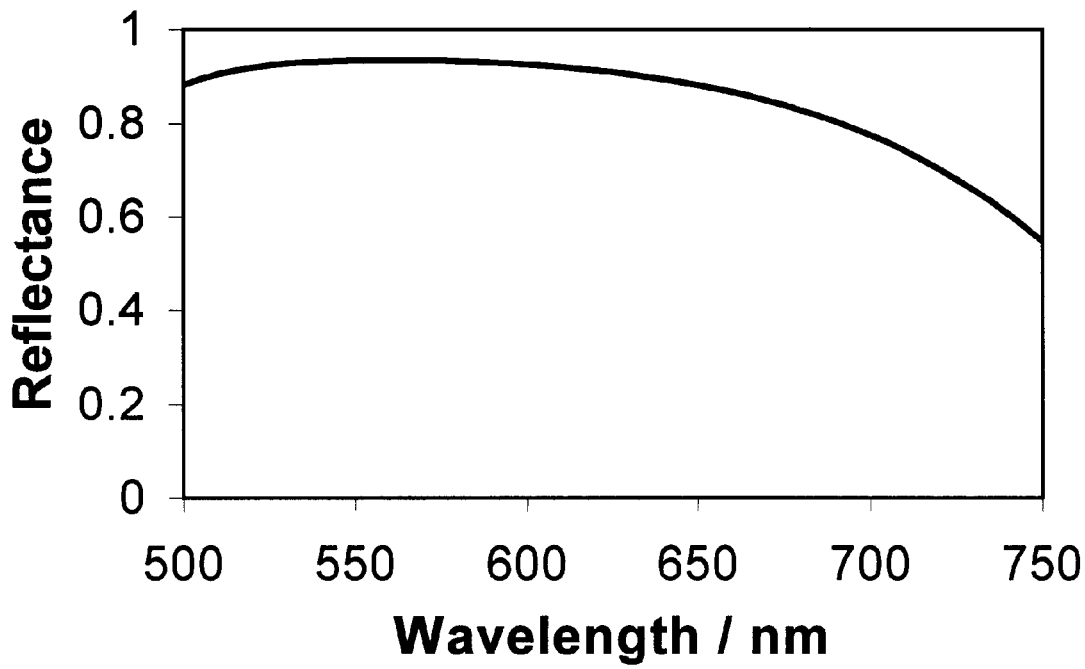
FIG. 9a is the calculated reflectance spectrum and FIG. 9b is the angular variation of the 570-nm reflectance of an LED in accordance with the embodiment of the present invention comprising an [AlOx-AlInP]3 BR.
Figure 9B:
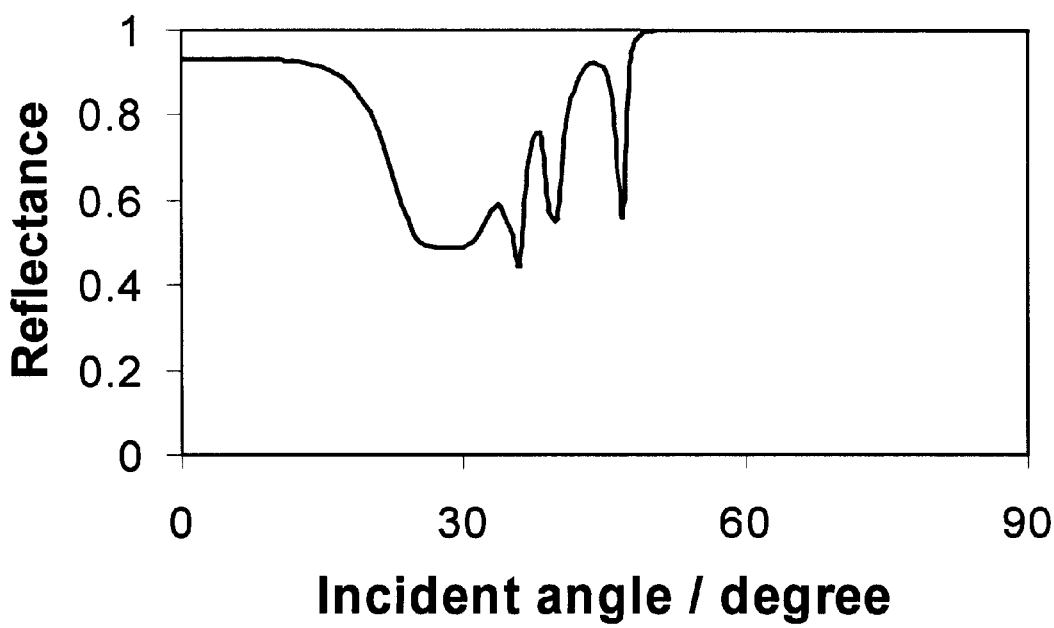
Figure 10A:
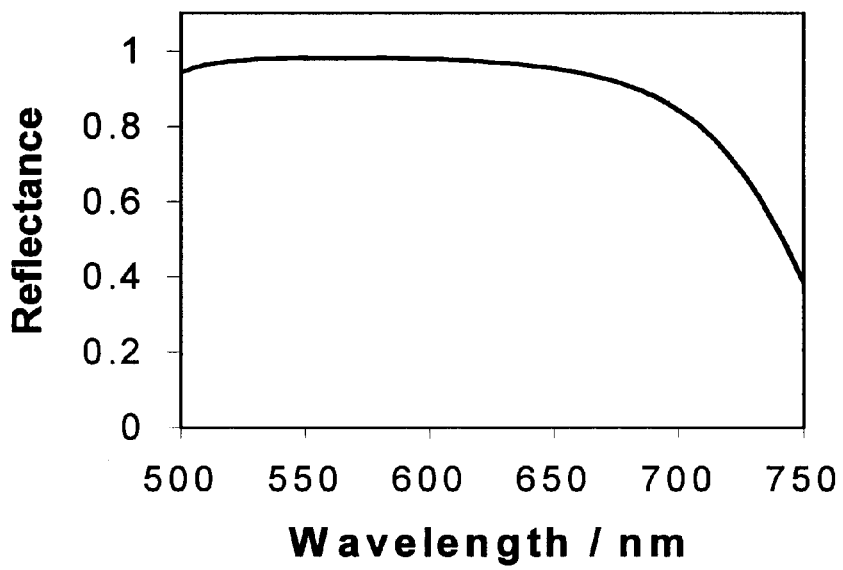
FIG. 10a is the calculated reflectance spectrum and FIG. 10b is the angular variation of the 570-nm reflectance of an LED in accordance with the embodiment of the present invention comprising an [AlOx-AlInP]3-AlOx quarter-wave stack.
Figure 10B:
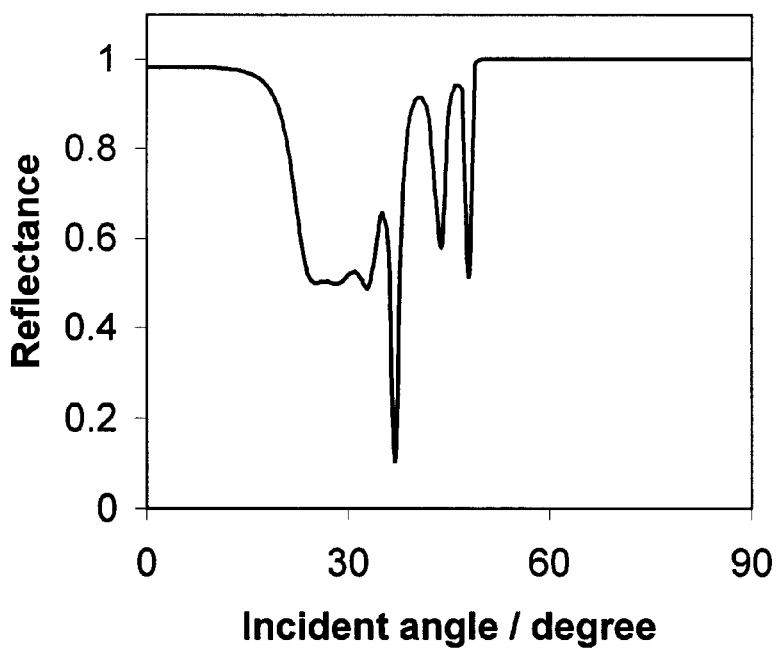

FIG. 9a shows the calculated reflectance spectrum and FIG. 9b the angular variation of the 570-nm reflectance of an LED in accordance with the embodiment of the present invention comprising an [AlOx-AlInP]3 BR. A broad high reflectance band is obtained with 90% reflectance at 570 nm. The angular reflectance spectrum shows that a higher percentage of the emitted light is recovered than that for the [AlOx-GaAs]3 counter part. Even better results are achieved using the improved [LH]n-L design. FIG. 10a shows the calculated reflectance spectrum and FIG. 10b the angular variation of the 570-nm reflectance of an LED in accordance with the embodiment of the present invention comprising an [AlOx-AlInP]3-AlOx quarter-wave reflector. The reflectance is greater than 90% in the 500 nm to 650 nm region of the spectrum and the lights entering at an angle greater than 50 degree are nearly fully recovered.

Figure 11A:
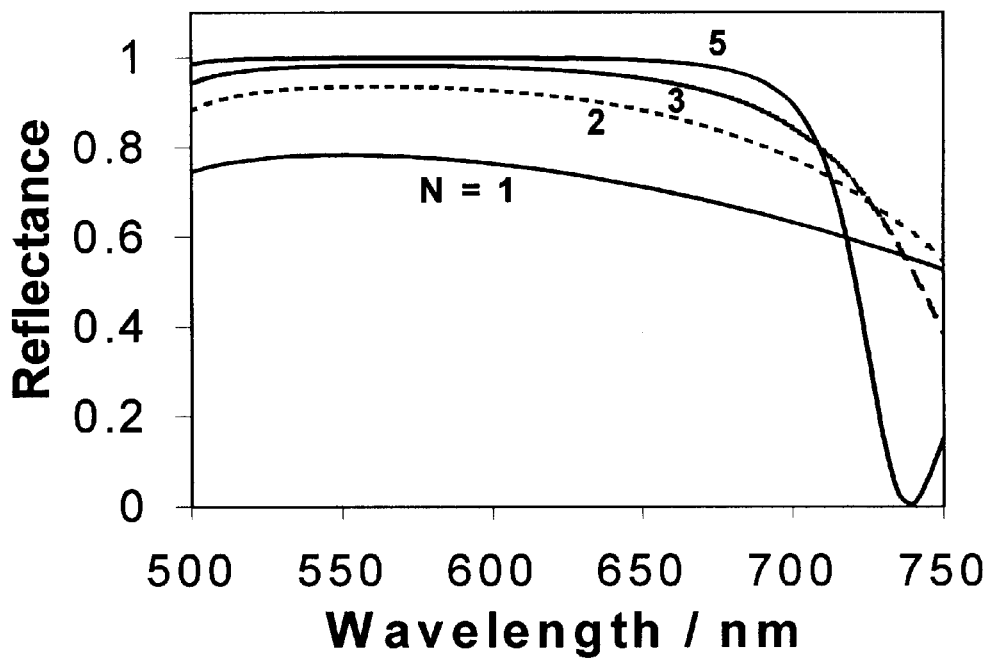
FIG. 11a shows the variation of the reflectance spectrum with the number of quarter-wave pairs and FIG. 11b shows the angular variation of the 570-nm reflectance of an [LH] 5-L reflector in accordance with the embodiment of the present invention comprising an [AlOx-AlInP]n-AlOx quarter-wave stack.
Figure 11B:
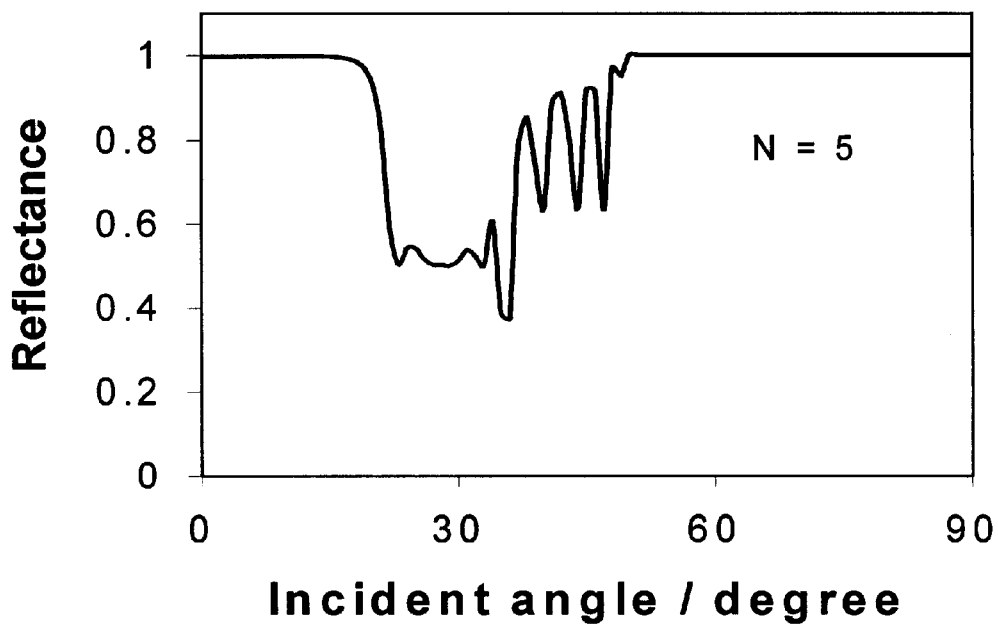

FIG. 11a shows how the reflectance spectrum varies with the number of quarter-wave pairs and FIG. 11b shows the angular dependence of the 570-nm reflectance of a reflector with n=5 in accordance with the preferred embodiment of the present invention comprising an [AlOx-AlInP]n-AlOx quarter-wave stack. As the number of pairs increases to 5, the reflector behaves more like a perfect mirror in the 500 nm to 680 nm region of the spectrum. The high- and low-angle incident lights are nearly fully recovered and the reflectance is about 50% even at the bottom of the V-curve. Owning to the large refractive-index ratio of the present quarter-wave stack, only a small number of pairs are needed to achieve high reflectance and a broad bandwidth.

The broad bandwidth of the quarter-wave reflector in the present invention allows for the use of a common reflector design for LED's of different colors thus greatly simplifying the fabrication process. The high reflecting power of the structured reflector in the present invention assures a minimum loss of the downward light emission of the LED. As a result, the manufacturing method in the present invention is very useful in the fabrication of high-efficiency bright light-emitting devices.

What is claimed is:

1. A semiconductor light-emitting device comprising:

a textured substrate of semiconductor material;

a first electrode disposed on a first surface of said textured substrate;

a first reflector stack portion disposed on a second surface of said textured substrate;

a second reflector stack portion disposed on said second surface of said textured substrate, said second reflector portion being disposed at an elevation laterally and vertically offset from said first reflector stack portion so as to be isolated therefrom and to thereby define a current injection path therebetween;

an active layer bound by an upper and a lower confining layer disposed on a surface containing said first and second reflector stack portions;

a window layer disposed on a surface of said upper confining layer;

a contact layer disposed on a surface of said window layer; and a second electrode disposed on a surface of said contact layer.

2. The device of claim 1, wherein each said reflector stack portion is a Bragg reflector comprising a plurality of quarter-wave low- and high-index layers at an emission wavelength of the LED.

3. The device of claim 2, wherein said quarter-wave layer contains alloys such as AlGaAs and AlGaInP having an aluminum content between 0 and 1.

4. The device of claim 1, wherein each said reflector stack portion comprises a plurality of quarter-wave low- and high-index layers at an emission wavelength of the LED.

5. The device of claim 4, wherein said quarter-wave layer contains alloys such as AlGaAs and AlGaInP having an aluminum content between 0 and 1.

6. The device of claim 2, wherein each said reflector stack portion has n pairs of quarter-wave low- and high-index layers with n between 1 and 25.

7. The device of claim 4, wherein each said reflector stack portion has n pairs of quarter-wave low- and high-index layers with n between 1 and 25.

8. The device of claim 2, wherein each said reflector stack portion has a refractive-index ratio $n_H/n_L$ greater than 1.

9. The device of claim 4, wherein each said reflector stack portion has a refractive-index ratio $n_H/n_L$ greater than 1.

10. The device of claim 2, wherein each said reflector stack portion has a broadband, high reflectivity at an emission wavelength of the LED.

11. The device of claim 4, wherein each said reflector stack portion has a broadband, high reflectivity at an emission wavelength of the LED.

12. The device of claim 2, wherein said low-index layer is AlOx.

13. The device of claim 4, wherein said low-index layer is AlOx.

14. The device of claim 4, wherein said low- (L) and high- (H) index layers constitute a [L–H]n–L quarter-wave stack at an emission wavelength of the LED.

* * * * *